(12) United States Patent
Liu (10) Patent No.: US 11,164,865 B2
(45) Date of Patent: Nov. 2, 2021

(54) BI-DIRECTIONAL TRANSISTOR DEVICES HAVING ELECTRODE COVERING SIDEWALL OF THE FIN STRUCTURE

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 593 days.

(21) Appl. No.: 16/155,551

(22) Filed: Oct. 9, 2018

(65) Prior Publication Data

US 2020/0111780 A1 Apr. 9, 2020

(51) Int. Cl.
*H01L 27/088* (2006.01)
*H01L 27/02* (2006.01)
*H01L 29/78* (2006.01)

(52) U.S. Cl.
CPC ...... *H01L 27/0886* (2013.01); *H01L 27/0248* (2013.01); *H01L 29/7817* (2013.01)

(58) Field of Classification Search
CPC ............ H01L 27/0886; H01L 27/0924; H01L 27/10826; H01L 27/10879; H01L 29/41791; H01L 29/785; H01L 29/7858
See application file for complete search history.

(56) References Cited

U.S. PATENT DOCUMENTS

2018/0122942 A1* 5/2018 Ponoth .............. H01L 29/78624

* cited by examiner

*Primary Examiner* — Hoai V Pham
(74) *Attorney, Agent, or Firm* — Morgan, Lewis & Bockius LLP (57) ABSTRACT

A transistor device includes a substrate a first transistor structure. The first transistor structure includes a first fin structure on the substrate. The first fin structure includes a first doped region, and a second fin structure on the substrate spaced apart from the first fin structure. The second fin structure includes a second doped region and a third doped region spaced apart from the second doped region. The transistor device includes a first electrode on the second fin structure and covering a first end of the second fin structure.

20 Claims, 5 Drawing Sheets

BI-DIRECTIONAL TRANSISTOR DEVICES HAVING ELECTRODE COVERING SIDEWALL OF THE FIN STRUCTURE

FIELD OF THE DISCLOSURE

Example embodiments are generally directed toward transistor devices, and more particularly, to bi-directional Fin field-effect transistor (FinFET) devices.

BACKGROUND

Transistors have a wide variety of applications in electronics. In applications that utilize power switches for battery (e.g., rechargeable battery) protection from short circuits and/or overcharging, transistor devices may be employed.

BRIEF DESCRIPTION OF THE DRAWINGS

Inventive concepts are described in conjunction with the appended figures, which are not necessarily drawn to scale.

DETAILED DESCRIPTION

At least one example embodiment relates to devices that include FinFET laterally diffused metal-oxide-semiconductor (LDMOS)-based transistor structures that suppress snapback and/or improve a safe operating area of the device.

The ensuing description provides example embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," "including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1:
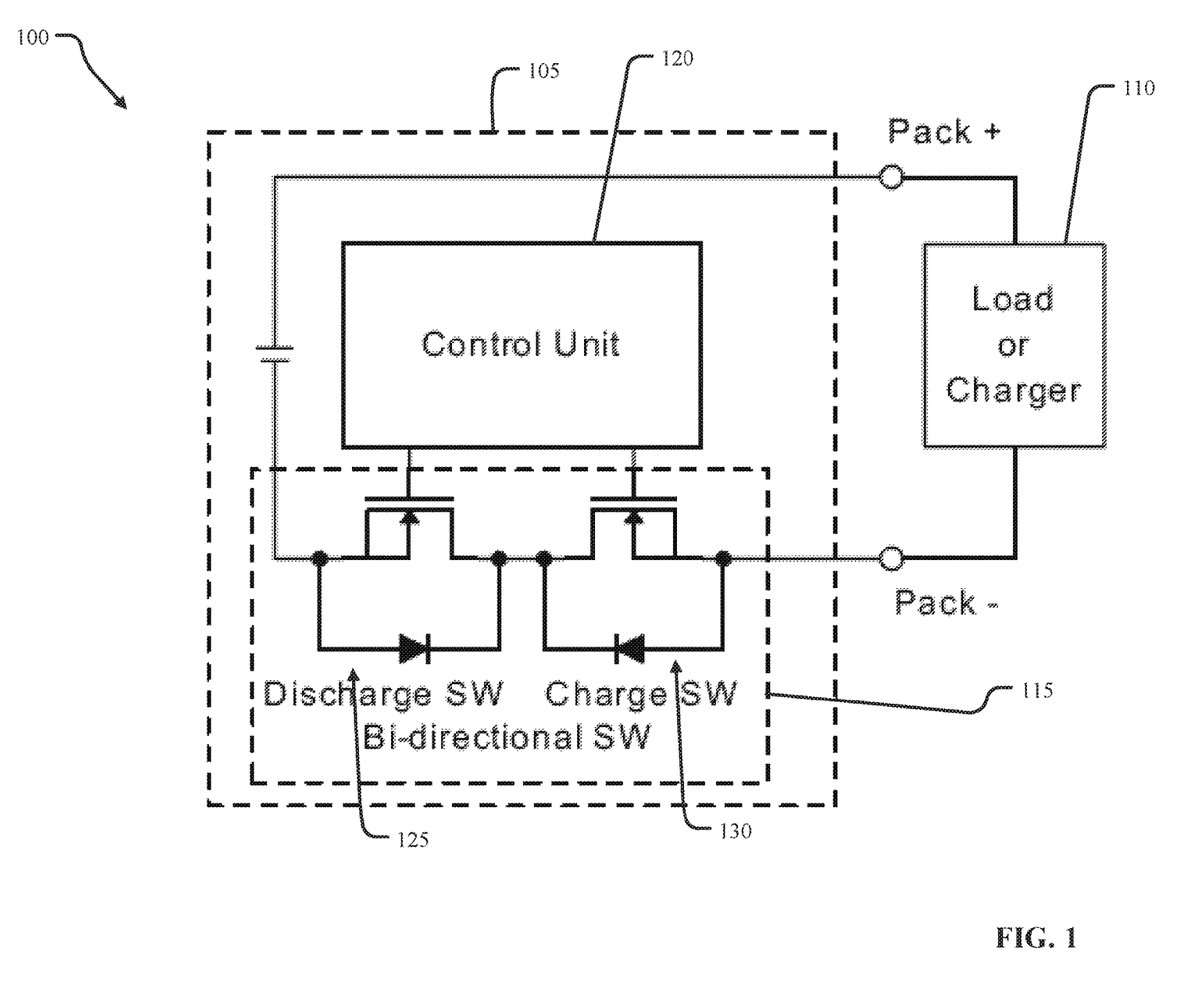
FIG. 1 illustrates a system according to at least one example embodiment.

FIG. 1 illustrates a system 100 according to at least one example embodiment. The system 100 includes a circuit protection device 105 and a load or charger 110 coupled to the circuit protection device 105. In the event that a load 110 is coupled to the circuit protection device 105, the load 110 may be an electric motor (e.g., of a vehicle) or other power consuming device. In the event that a charger 110 is coupled to the circuit protection device 105, the charger 110 may be a power source for charging a battery of a power consuming device (e.g., a battery of a vehicle).

The circuit protection device 105 includes a transistor device 115 acting as a circuit protection mechanism and a control unit or controller 120 that controls the transistor device 115. The transistor device 115 may include a bidirectional transistor device in accordance with at least one example embodiment. In FIG. 1, the bidirectional transistor device comprises a first transistor structure 125 and a second transistor structure 130. The first and second transistor structures 125/130 are described in more detail below with reference to FIGS. 2-4.

The controller 120 may include any hardware and/or software for controlling elements of the system 100. For example, the controller 120 may include a memory including instructions and a processor for executing the instructions to exert control over the system 100. The controller may also include an application specific integrated circuit (ASIC) and/or other circuitry for controlling the system 100. For example, the controller 120 controls the transistor device 115 to control current flow within the system 100. In at least one example embodiment, the transistor device 115 is a bi-directional switch.

Figure 2:
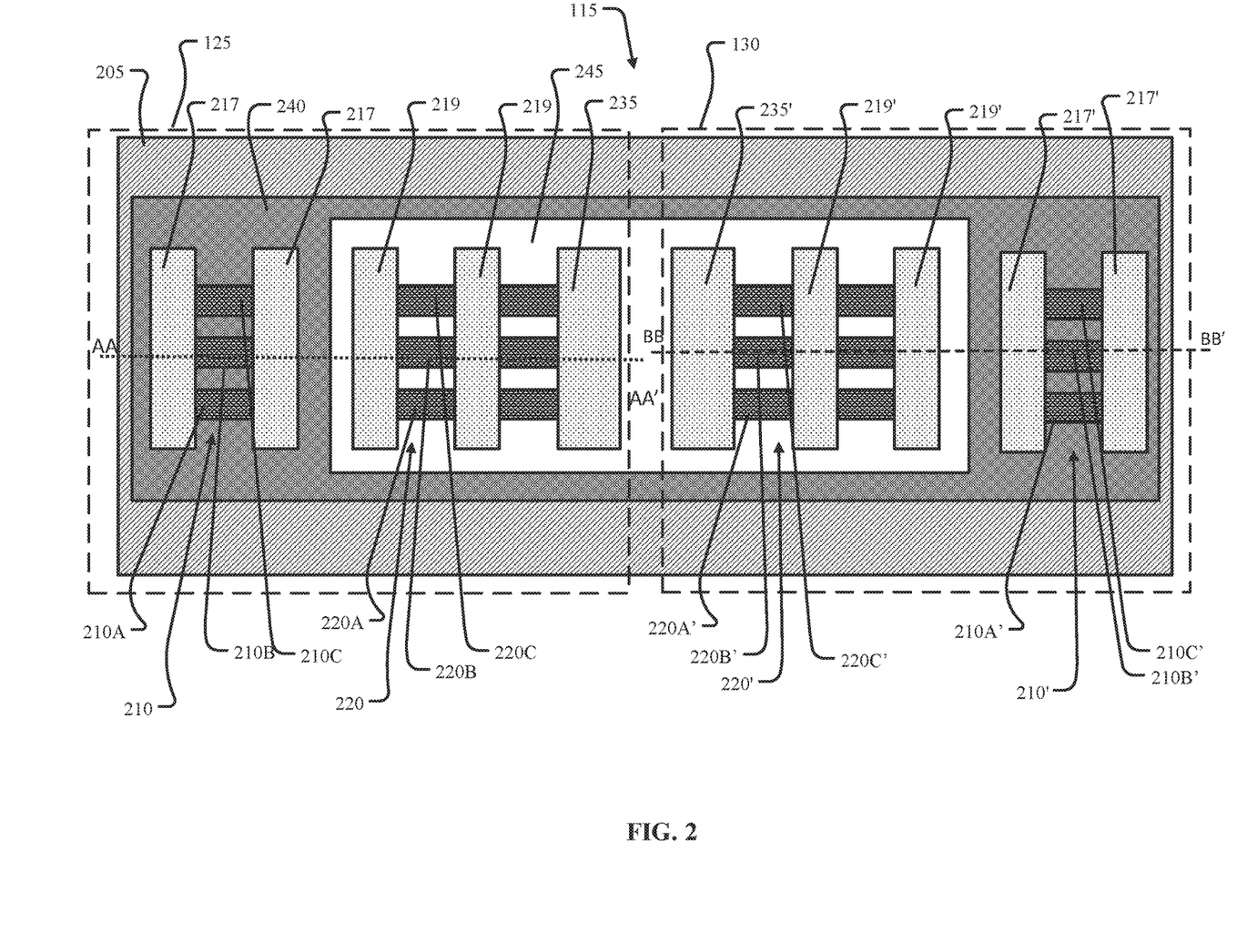
FIG. 2 illustrates a plan view of a transistor device according to at least one example embodiment.
Figure 3A:
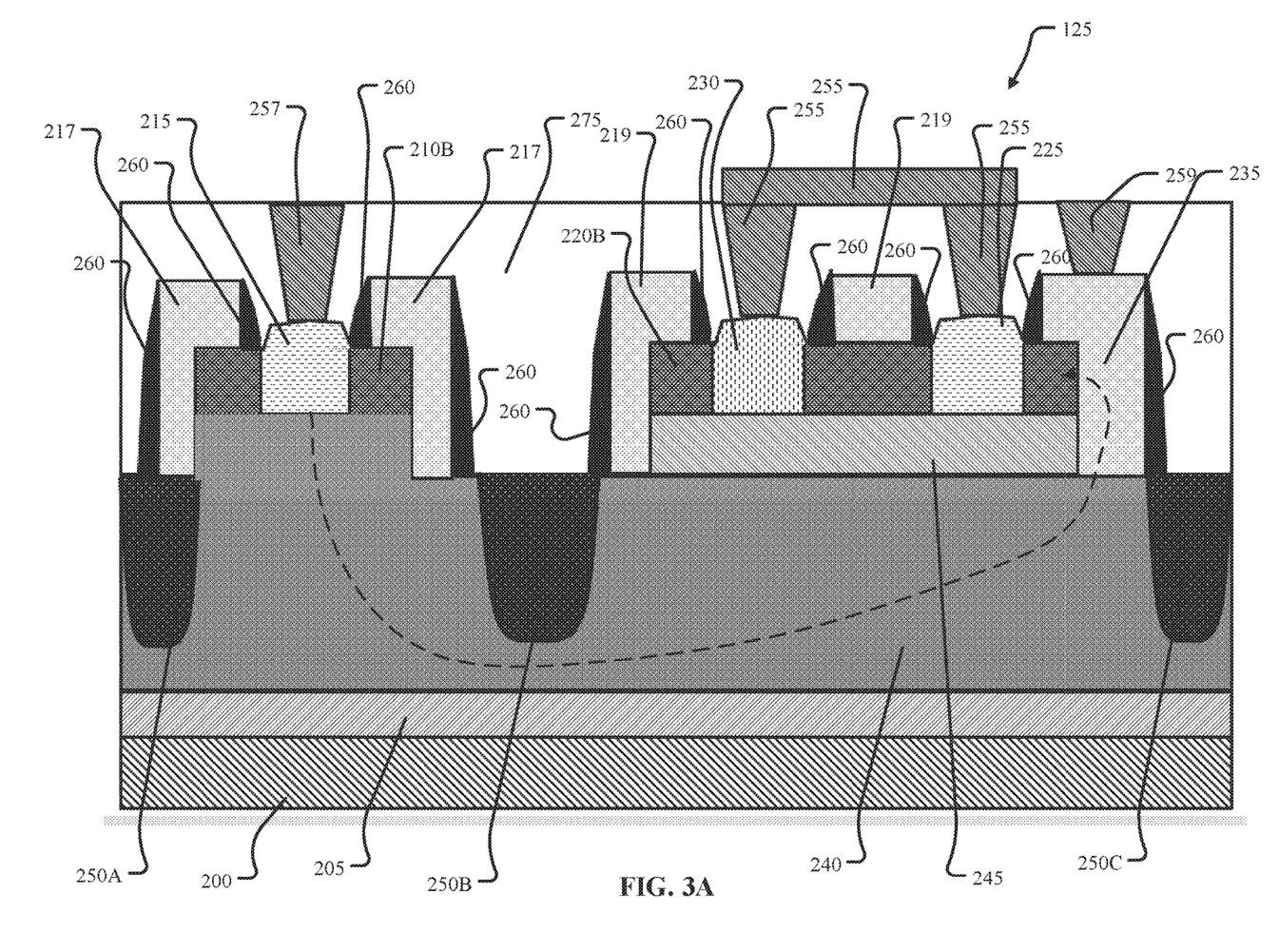
FIG. 3A illustrates a cross-sectional view of the transistor device along line AA-AA' in FIG. 2 according to at least one example embodiment.
Figure 3B:
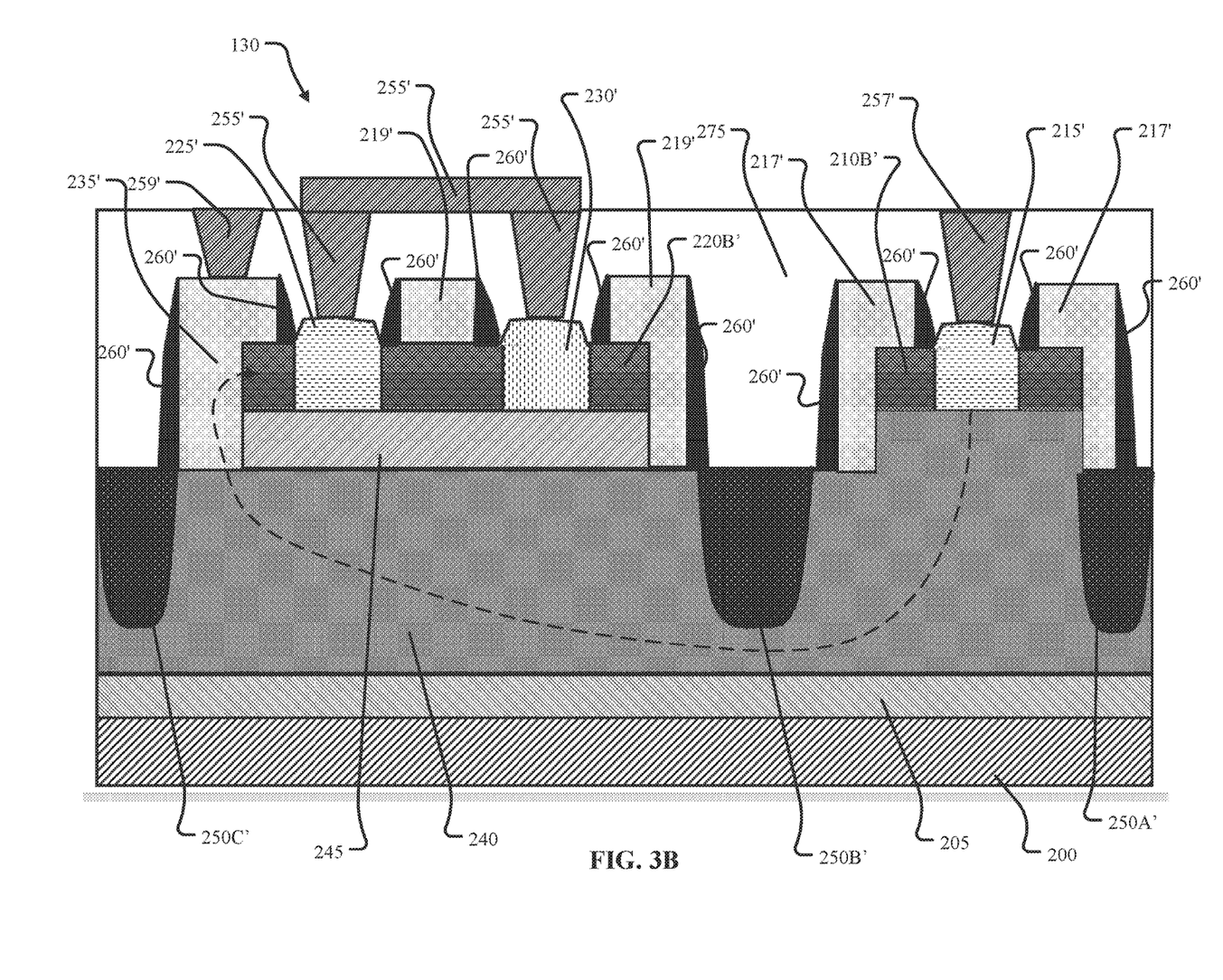
FIG. 3B illustrates a cross-sectional view of the transistor device along line BB-BB' in FIG. 2 according to at least one example embodiment.

FIG. 2 illustrates a plan view of the transistor device 115 including a first transistor structure 125 and a second transistor structure 130 according to at least one example embodiment. FIG. 3A illustrates a cross-sectional view of the transistor structure 125 along line AA-AA' in FIG. 2 according to at least one example embodiment. FIG. 3B illustrates a cross-sectional view of the transistor structure 130 along line BB-BB' in FIG. 2 according to at least one example embodiment. Here, it should be appreciated that various elements of the transistor structures 125/130 may be omitted from the various views of the figures for the convenience of illustration. For example, FIG. 2 does not show all elements of the substrate 200 included in FIGS. 3A and 3B to avoid confusion with other elements of FIG. 2.

With reference to FIGS. 1-3B, the transistor device 115 includes a substrate 200. The substrate 200 may comprise a semiconductor material such as silicon. The transistor device 115 includes a first transistor structure 125 and a second transistor structure 130.

The first transistor structure 125 includes a first fin structure 210 on the substrate 205. The first fin structure 210 includes a first doped region 215. The first transistor structure 125 includes a second fin structure 220 on the substrate 205 spaced apart from the first fin structure 210. The second fin structure 220 includes a second doped region 225 and a third doped region 230 spaced apart from the second doped region 225. As shown in FIG. 2, the first fin structure 215 and the second fin structure 220 each include a plurality of fins 215A-215C and 220A-220C. Each of the plurality of fins may comprise epitaxially grown semiconductor material, such as silicon. FIG. 2 illustrates an example showing three fins for each fin structure, however, example embodiments are not limited thereto and fewer or more fins may be included according to design preferences.

The first transistor structure 125 further comprises a first electrode 235 on the second fin structure 220 and covering a first end of the second fin structure 220. For example, as shown in FIG. 3A, the first electrode 235 covers a portion of an upper surface of an undoped portion of the second fin structure 220 and a sidewall of the second fin structure 220.

According to at least one example embodiment, the first doped region 215 and the second doped region 225 have a first conductivity type, and the third doped region 230 has a second conductivity type different than the first conductivity type. As shown, the second doped region 225 is closer to the first end of the second fin structure 220 than the third doped region 230. For example, the third doped region 230 is between the first doped region 215 and the second doped region 225. In at least one example embodiment, the first doped region 215 is a drain region and the second doped region 225 is a source region of the first transistor structure 125. As shown, the first, second, and third doped regions 215/225/230 may include raised portions that protrude from an upper surface of the fin structures 210 and 220.

In the example shown in FIGS. 2 and 3A, the doped regions 215 and 225 may be n-type and the doped region 230 may be p-type. However, example embodiments are not limited thereto, and the conductivity type of the regions 215/225/230 may be reversed according to design preferences.

As shown in FIG. 3A, the substrate 200 includes a first well region 240 and a second well region 245. The first well region 240 may have the first conductivity type (e.g., n-type), and the first fin structure 215 is positioned on the first well region 240. The second well region may have the second conductivity type (e.g., p-type), and the second fin structure 220 is positioned on the second well region 245.

The substrate 200 may further include one or more isolation regions 250A-250C formed in the well region 240. For example, the isolation regions 250A-250C are formed as shallow trench isolation (STI) regions including an oxide material or other suitable insulator. As shown in FIG. 3A, the isolation region 250B is between the first fin structure 215 and the second fin structure 220.

As also shown in FIG. 3A, the transistor device 115 includes one or more wirings 255 that electrically connect the second doped region 225 to the third doped region 230. The wirings 255 may include a metal such as copper or tungsten, or other suitable conductor. The one or more wirings 255 may serve as a source contact for the source region 225.

The substrate 200 may include a well region 205 (e.g., a deep n-well region (DNW)). The well region 205 may be between the substrate 200 and the well region 240. The well region 205 may have a same conductivity type as the well region 240 but a different doping concentration than the well region 240. For example, the doping concentration of the well region 205 is less than the doping concentration of the well region 240.

The transistor device 115 may include a layer 275 formed on the substrate 200. The layer 275 may include an insulation material, such as an oxide. The one or more wirings 255 may be formed in the layer 275. The layer 275 may further include wirings 257 and 259 formed therein. The wiring 257 may be a correspond to a drain contact for the drain region 215, and the wiring 259 may correspond to a gate contact for the gate electrode 235.

The transistor device 115 may further include electrodes 217 covering both ends of the first fin structure 210. For example, the electrodes 217 cover upper surfaces and sidewalls of undoped portions of the fin structure 210.

The transistor device 115 may further include electrode 219 covering a second end of the second fin structure 220. For example, the electrode 219 covers an upper surface and a sidewall of an undoped portion of the fin structure 220. The electrodes 217 and 219 are dummy electrodes that may assist with confining epitaxial growth of the fin structures 210 and 220. The transistor device 115 may further include a plurality of spacers 260 on the electrodes 217/219/235. The electrodes 217/219/235 may comprise a conductive material, such as copper or tungsten. The spacers 260 may include an insulation material, such as an oxide.

As shown in FIG. 2, the transistor device 115 may further include a second transistor structure 130 spaced apart from the first transistor structure 125. FIG. 3B illustrates a cross-sectional view of the second transistor structure 130, which is the same cross-sectional structure as the first transistor structure 125 but mirrored. Accordingly, elements of the second transistor structure 130 are referred to in FIGS. 2 and 3B with the same numbered elements as the first transistor structure 125 but with a "'" (e.g., 215'). The second transistor structure 130 includes a third fin structure 210' on the substrate 200 and a fourth fin structure 220' on the substrate 200. The third fin structure 210' includes a fourth doped region 215'. The fourth fin structure 220' is spaced apart from the third fin structure 210'. The fourth fin structure 220' includes a fifth doped region 225' and a sixth doped region 230' spaced apart from the fifth doped region 225'. Similar to the electrode 235 of the first transistor structure 125, the second transistor structure 130 further includes a second electrode 235' on the fourth fin structure 220' and covering a first end of the fourth fin structure 220' (e.g., covering an upper surface of and a sidewall of an undoped portion of the fin structure 220'). Similar to the first and second doped region 215/225, the fourth doped region 215' and the fifth doped region 225' may have the first conductivity type (e.g., n-type). Similar to the third doped region 230, the sixth doped region 230' may have the second conductivity type (e.g., p-type). All doped regions of the fin structures 210/220/210'/220' may have a doping concentration of about 1E19~1E20/cm$^3$ of a selected conductivity type.

As shown in FIG. 2, a portion of the second electrode 235' is closer to a portion of the first electrode 235 than the first end of the fourth fin structure 220'.

Similar to the first and second fin structures 210/220, the third fin structure 210' and the fourth fin structure 220' each include a plurality of fins 210A'-210C' and 220A'-220C'. In at least one example embodiment, the fourth doped region 215' is a drain region and the fifth doped region 225' is a source region of the second transistor structure 130.

In operation, the controller 120 may supply a voltage (e.g., a gate voltage) to the electrodes 235/235' to turn the first transistor structure 125 and the second transistor structure 130 on. FIGS. 3A and 3B illustrate the current path from drain to source with the dashed arrows. Here, it should be appreciated that the current path passes under the isolation regions 250B/250B' and that electrons are accumulated at the undoped portions of the fin structures 220/220' between the doped portions 225/225' and electrodes 235/235'. When the transistor structures 125/130 are turned off (e.g., when the gate voltage is 0V), the structures 125/130 have NPN junctions to block current.

In view of the above, it should be appreciated that at least one example embodiment includes a (FinFET) device 115 including a substrate 200 and a first transistor structure 125. The first transistor structure 125 includes a first fin structure 210 on the substrate 200. The first fin structure 210 includes a first doped region 215 having a first conductivity type (e.g., n-type). The first transistor structure 125 includes a second fin structure 220 on the substrate 200 and spaced apart from the first fin structure 210. The second fin structure 220 includes a second doped region 225 having the first conductivity type and a third doped region 230 spaced apart from the second doped region 225. The third doped region 230 has a second conductivity type (e.g., p-type) different than the first conductivity type. The first transistor structure includes a first electrode 235 on the second fin structure 220 and covering a first sidewall of the second fin structure 220.

The substrate 200 includes a first well region 240 having the first conductivity type, and the first fin structure 210 is positioned on the first well region 240. The substrate 200 includes a second well region 245 having the second conductivity type, and the second fin structure 220 is positioned on the second well region 245. The substrate further includes an isolation region 250B that is between the first doped region 215 and the third doped region 230.

In at least one example embodiment, the second doped region is closer to the first sidewall of the second fin structure than the third doped region. Further, an undoped region of the second fin structure 220 may be between the second doped region 225 and first electrode 235.

The FinFET device may further include a second transistor structure 130 on the substrate 200 and spaced apart from the first transistor structure 125. The second transistor structure includes a third fin structure 210' on the substrate. The third fin structure includes a fourth doped region 215' having the first conductivity type. The second transistor structure 130 includes a fourth fin structure 220' on the substrate and spaced apart from the third fin structure 210'. The fourth fin structure 220' includes a fifth doped region 225' and a sixth doped region 230' spaced apart from the fifth doped region 225'. The fifth doped region 225' has the first conductivity type and the sixth doped region 230' has the second conductivity type. The second transistor structure further includes a second electrode 235' on the fourth fin structure 220' and covering a first sidewall of the fourth fin structure 220'.

The first doped region 215 and the fourth doped region 215' may be source regions, the second doped region 225 and the fifth doped region 225' may be drain regions, and the first electrode 235 and the second electrode 235' are gate electrodes.

In at least one example embodiment, a transistor device includes a substrate 200, a first transistor structure 125 and a second transistor structure 130. The first transistor structure includes a first fin structure 210 on the substrate 200, and the first fin structure 210 includes a first doped region 215 having a first conductivity type (e.g., n-type). The transistor structure includes a second fin structure 220 on the substrate 200 and spaced apart from the first fin structure 210. The second fin structure 220 includes a second doped region 225 having the first conductivity type and a third doped region 230 spaced apart from the second region. The third doped region has a second conductivity type (e.g., p-type) different than the first conductivity type. The first transistor structure 125 includes a first gate electrode 235 on the second fin structure 220 and covering an upper surface and a first sidewall of an undoped portion of the second fin structure 220.

The transistor device includes a second transistor structure 130. The second transistor structure 130 includes a third fin structure 210' on the substrate 200, and the third fin structure includes a fourth doped region 215' having the first conductivity type. The second transistor structure 130 includes a fourth fin structure 220' on the substrate 200 and spaced apart from the third fin structure 210'. The fourth fin structure includes a fifth doped region 225' and a sixth doped region 230' spaced apart from the fifth doped region 225'. The fifth doped region has the first conductivity type and the sixth doped region has the second conductivity type. The second transistor structure 130 includes a second gate electrode 235' on the fourth fin structure 220' and covering an upper surface and a first sidewall of an undoped portion of the fourth fin structure 220'.

In at least one example embodiment, the second doped region 215 and the fifth doped region 215' are electrically connected such that first transistor structure 125 and the second transistor structure 130 form a bi-directional switch. In this case, the first and fourth doped regions 215/215' are one of source or drain regions, and the second and fifth doped regions 225/225' are the other one of the source or drain regions.

Here, it should be appreciated that FIGS. 1-3B illustrate an N-LDMOS structure. However, example embodiments are not limited thereto and may be applied to other structures such as P-LDMOS structures, other FinFET transistors, etc.

Figure 4:
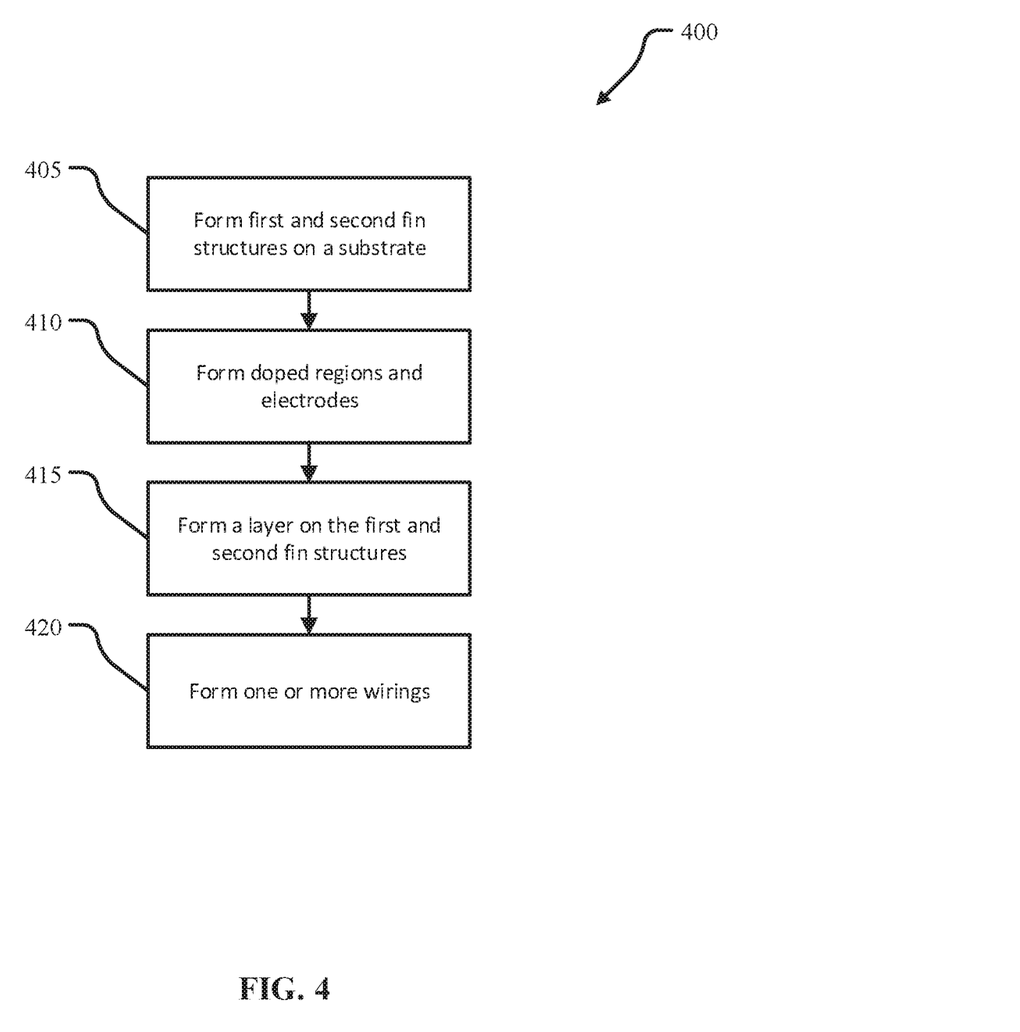
FIG. 4 illustrates a method of forming the transistor device in FIGS. 2-3B according to at least one example embodiment.

FIG. 4 illustrates a method 400 of forming the transistor structure in FIGS. 1-3B according to at least one example embodiment.

While a general order for the steps of the method 400 is shown in FIG. 4, the method 400 can include more or fewer steps or can arrange the order of the steps differently than those shown in FIG. 4. Generally, the method 400 starts at operation 405 and ends at operation 430. Hereinafter, FIG. 4 shall be explained with reference FIGS. 1-3B.

In operation 405, the method 400 includes forming first and second fin structures 125/130 on a substrate 200. Here, it should be understood that the substrate 200 may already include isolation regions 250A/250A'-250C/250C' and well regions 140/145, all formed using known etching, deposition, and/or implantation techniques.

In operation 410, the method 400 includes forming doped regions 215/215'/225/225'/230/230' and electrodes 217/217'/219/219'/235/235'. For example, forming the doped regions may include ion implantation of a desired impurity type along with their respective electrodes (and spacers 260/260').

In operation 415, the method 400 includes forming a layer 275 on the fin structures 210/210'/220/220'.

In operation 420, the method 400 includes forming one or more wirings 255/255'/257/257'/259/259' to create desired electrical connections between the transistor structures 125/130 and the controller 120.

In view of FIGS. 1-4, at least one example embodiment relates to devices that include FinFET LDMOS-based bidirectional transistor structures (e.g., back-to-back switches) that suppress snapback and/or improve a safe operating area.

In addition, it should be understood that specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. A transistor device, comprising:
a substrate; and
a first transistor structure, the first transistor structure including:
a first fin structure on the substrate, the first fin structure including a first doped region;
a second fin structure on the substrate spaced apart from the first fin structure, the second fin structure including a second doped region and a third doped region spaced apart from the second doped region; and
a first electrode on the second fin structure and covering a first end of the second fin structure.

2. The transistor device of claim 1, wherein the first doped region and the second doped region have a first conductivity type, and wherein the third doped region has a second conductivity type different than the first conductivity type.

3. The transistor device of claim 2, wherein the first transistor structure further comprises:
a pair of second electrodes covering respective sidewalls of the first fin structure.

4. The transistor device of claim 2, wherein the third doped region is between the first doped region and the second doped region.

5. The transistor device of claim 2, wherein the substrate further comprises:
a first well region having the first conductivity type, the first fin structure being positioned on the first well region; and
a second well region having the second conductivity type, the second fin structure being positioned on the second well region.

6. The transistor device of claim 5, wherein the substrate further comprises:
an isolation region between the first fin structure and the second fin structure.

7. The transistor device of claim 1, further comprising:
a wiring that electrically connects the second doped region to the third doped region.

8. The transistor device of claim 1, further comprising:
a second transistor structure spaced apart from the first transistor structure, the second transistor structure including:
a third fin structure on the substrate, the third fin structure including a fourth doped region;
a fourth fin structure on the substrate and spaced apart from the third fin structure, the fourth fin structure including a fifth doped region and a sixth doped region spaced apart from the fifth doped region; and
a second electrode on the fourth fin structure and covering a first end of the fourth fin structure.

9. The transistor device of claim 8, wherein a portion of the second electrode is closer to a portion of the first electrode than the first end of the fourth fin structure.

10. The transistor device of claim 9, wherein the first fin structure, the second fin structure, the third fin structure, and the fourth fin structure each include a plurality of fins.

11. A Fin field-effect transistor (FinFET) device, comprising:
a substrate; and
a first transistor structure, the first transistor structure including:
a first fin structure on the substrate, the first fin structure including a first doped region having a first conductivity type;
a second fin structure on the substrate and spaced apart from the first fin structure, the second fin structure including a second doped region having the first conductivity type and a third doped region spaced apart from the second doped region, the third doped region having a second conductivity type different than the first conductivity type; and a first electrode on the second fin structure and covering a first sidewall of the second fin structure.

12. The FinFET device of claim 11, wherein the substrate further comprises:
a first well region having the first conductivity type, the first fin structure being positioned on the first well region; and
a second well region having the second conductivity type, the second fin structure being positioned on the second well region.

13. The FinFET device of claim 12, wherein the substrate further comprises:
an isolation region between the first doped region and the third doped region.

14. The FinFET device of claim 11, wherein the second doped region is closer to the first sidewall of the second fin structure than the third doped region.

15. The FinFET device of claim 14, wherein an undoped region of the second fin structure is between the second doped region and first electrode.

16. The FinFET device of claim 11, further comprising:
a second transistor structure on the substrate and spaced apart from the first transistor structure, the second transistor structure including:
a third fin structure on the substrate, the third fin structure including a fourth doped region having the first conductivity type;
a fourth fin structure on the substrate and spaced apart from the third fin structure, the fourth fin structure including a fifth doped region and a sixth doped region spaced apart from the fifth doped region, the fifth doped region having the first conductivity type and the sixth doped region having the second conductivity type; and
a second electrode on the fourth fin structure and covering a first sidewall of the fourth fin structure.

17. The FinFET device of claim 16, wherein the first doped region and the fourth doped region are source regions, wherein the second doped region and the fifth doped region are drain regions, and wherein the first electrode and the second electrode are gate electrodes.

18. A transistor device, comprising:
a substrate;
a first transistor structure, the first transistor structure including:
a first fin structure on the substrate, the first fin structure including a first doped region having a first conductivity type;
a second fin structure on the substrate and spaced apart from the first fin structure, the second fin structure including a second doped region having the first conductivity type and a third doped region spaced apart from the second region, the third doped region having a second conductivity type different than the first conductivity type; and
a first gate electrode on the second fin structure and covering an upper surface and a first sidewall of an undoped portion of the second fin structure; and
a second transistor structure, the second transistor structure including:
a third fin structure on the substrate, the third fin structure including a fourth doped region having the first conductivity type;
a fourth fin structure on the substrate and spaced apart from the third fin structure, the fourth fin structure including a fifth doped region and a sixth doped region spaced apart from the fifth doped region, the fifth doped region having the first conductivity type and the sixth doped region having the second conductivity type; and
a second gate electrode on the fourth fin structure and covering an upper surface and a first sidewall of an undoped portion of the fourth fin structure.

19. The transistor device of claim 18, wherein the second doped region and the fifth doped region are electrically connected such that first transistor structure and the second transistor structure form a bi-directional switch.

20. The transistor device of claim 18, wherein the first and fourth doped regions are one of source or drain regions, and wherein the second and fifth doped regions are the other one of the source or drain regions.

* * * * *